(12) United States Patent
Plett

(10) Patent No.: US 7,593,821 B2
(45) Date of Patent: Sep. 22, 2009

(54) METHOD AND SYSTEM FOR JOINT BATTERY STATE AND PARAMETER ESTIMATION

(75) Inventor: Gregory L. Plett, Colorado Springs, CO (US)

(73) Assignee: LG Chem, Ltd. (KR)

( * ) Notice: Subject to any disclaimer, the term of this patent is extended or adjusted under 35 U.S.C. 154(b) by 435 days.

(21) Appl. No.: 10/995,599

(22) Filed: Nov. 23, 2004

(65) Prior Publication Data

US 2006/0111870 A1   May 25, 2006

(51) Int. Cl.
*G01R 19/00* (2006.01)
*H02J 7/00* (2006.01)

(52) U.S. Cl. .......................... 702/63; 320/132

(58) Field of Classification Search ................ 320/118, 320/132; 324/429, 433; 702/63, 64, 181–182; 703/2
See application file for complete search history.

(56) References Cited

U.S. PATENT DOCUMENTS

| | | | |
|---|---|---|---|
| 6,534,954 B1 * | 3/2003 | Plett | 320/132 |
| 7,109,685 B2 * | 9/2006 | Tate et al. | 320/132 |
| 2002/0169581 A1 * | 11/2002 | Sarfert | 702/182 |
| 2006/0100833 A1 * | 5/2006 | Plett | 703/2 |
| 2006/0111854 A1 * | 5/2006 | Plett | 702/63 |

OTHER PUBLICATIONS

Gregory L. Plett; LiPB Dynamic Cell Models for Kalman-Filter SOC Estimation; The 19th International Battery, Hybrid and Fuel Electric Vehicle Symposium and Exhibition; Oct. 19-23, 2002; Busan, Korea; pp. 1-12.

Gregory L. Plett; Kalman-Filter SOC Estimation for LiPB HEV Cells; The 19th International Battery, Hybrid and Fuel Electric Vehicle Symposium and Exhibition; Oct. 19-23, 2002; Busan, Korea; pp. 1-12.

Gregory L. Plett; Extended Kalman Filtering for Battery Management Systems of LiPB-based HEV Battery Packs Part 2 Modeling and Identification; Journal of Power Sources 134; 2004; pp. 262-276.

Gregory L. Plett; Extended Kalman Filtering for Battery Management Systems of LiPB-based HEV Battery Packs Part 3 State and Parameter Estimation; Journal of Power Sources 134; 2004; pp. 277-292.

Stephen W. Moore and Peter J. Schneider; A Review of Cell Equalization Methods for Lithium Ion and Lithium Polymer Battery Systems; 2001 Society of Automotive Engineers; Jan. 2001; pp. 1-5.

Eric A. Wan and Alex T. Nelson; Dual Extended Kalman Filter Methods; Kalman Filtering and Neural Networks; 2001; pp. 123-173.

Greg Welch and Gary Bishop; An Introduction to the Kalman Filter; SIGGRAPH 2001 Course 8; Los Angeles, California; Aug. 12-17, 2001; http://info.acm.org/pubs/toc/CRnotice.html; pp. 1-47.

* cited by examiner

*Primary Examiner*—Akm E Ullah
*Assistant Examiner*—Jue Zhang
(74) *Attorney, Agent, or Firm*—Cantor Colburn LLP

(57) ABSTRACT

A method and apparatus for estimation of the augmented state of an electrochemical cell, the method comprising: making an internal augmented states prediction of the cell where the augmented state comprises at least one internal state value and at least one internal parameter value; making an uncertainty prediction of the internal augmented states prediction; correcting the internal augmented states prediction and the uncertainty prediction; and applying an algorithm that iterates the making an internal augmented states prediction, the making an uncertainty prediction and the correcting to yield an ongoing estimation to the augmented state and an ongoing uncertainty to the augmented state estimation.

50 Claims, 2 Drawing Sheets

METHOD AND SYSTEM FOR JOINT BATTERY STATE AND PARAMETER ESTIMATION

BACKGROUND

The present invention relates to methods and apparatus for estimation of battery pack system state and model parameters using digital filtering techniques. In particular, joint Kalman filtering and joint extended Kalman filtering.

In the context of rechargeable battery pack technologies, it is desired in some applications to be able to estimate quantities that are descriptive of the present battery pack condition, but that may not be directly measured. Some of these quantities may change rapidly, such as the pack state-of-charge (SOC), which can traverse its entire range within minutes. Others may change very slowly, such as cell capacity, which might change as little as 20% in a decade or more of regular use. The quantities that tend to change quickly comprise the "state" of the system, and the quantities that tend to change slowly comprise the time varying "parameters" of the system.

In the context of the battery systems, particularly those that need to operate for long periods of time, as aggressively as possible without harming the battery life, for example, in Hybrid Electric Vehicles (HEVs), Battery Electric Vehicles (BEVs), laptop computer batteries, portable tool battery packs, and the like, it is desired that information regarding quickly varying parameters (e.g., SOC) be used to estimate how much battery energy is presently available to do work, and so forth. Further, it may be desirable to ascertain information regarding slowly varying parameters (e.g., total capacity) in order to keep the prior calculations precise over the lifetime of the pack, extending its useful service time, and help in determining the state-of-health (SOH) of the pack.

There are a number of existing methods for estimating the state of a cell, which are generally concerned with estimating three quantities: SOC (a quickly varying quantity), power-fade, and capacity-fade (both slowly time varying). Power fade may be calculated if the present and initial pack electrical resistances are known, and capacity fade may be calculated if present and initial pack total capacities are known, for example, although other methods may also be used. Power- and capacity-fade are often lumped under the description "state-of-health" (SOH). Some other information may be derived using the values of these variables, such as the maximum power available from the pack at any given time. Additional state members or parameters may also be needed for specific applications, and individual algorithms would typically be required to find each one.

SOC is a value, typically reported in percent that indicates the fraction of the cell capacity presently available to do work. A number of different approaches to estimating SOC have been employed: a discharge test, ampere-hour counting (Coulomb counting), measuring the electrolyte, open-circuit voltage measurement, linear and nonlinear circuit modeling, impedance spectroscopy, measurement of internal resistance, coup de fouet, and some forms of Kalman filtering. The discharge test must completely discharge the cell in order to determine SOC. This test interrupts system function while the test is being performed and can be overly time consuming rendering it not useful for many applications. Ampere-hour counting (Coulomb counting) is an "open loop" methodology whose accuracy degrades over time by accumulated measurement error. Measuring the electrolyte is only feasible for vented lead-acid batteries, and therefore has limited applicability. Open-circuit voltage measurement may be performed only after extended periods of cell inactivity, and for cells with negligible hysteresis effect and does not work in a dynamic setting. Linear and nonlinear circuit modeling methods do not yield SOC directly; SOC must be inferred from the calculated values. Impedance spectroscopy requires making measurements not always available in a general application. Measurement of internal resistance is very sensitive to measurement error, and requires measurements not available in general applications. Coup de fouet works for lead-acid batteries only. Forms of Kalman filtering that do not use SOC as a filter state do not directly yield error bounds on the estimate. In another method, described in U.S. Pat. No. 6,534,954, which is incorporated by reference herein in its entirety, a filter, preferably a Kalman filter is used to estimate SOC by employing a known mathematical model of cell dynamics and measurements of cell voltage, current, and temperature. This method directly estimates state values. However, it does not address parameter values.

Not only is knowledge of SOC desired, but also knowledge of SOH. In this context, power fade refers to the phenomenon of increasing cell electrical resistance as the cell ages. This increasing resistance causes the power that can be sourced/sunk by the cell to drop. Capacity fade refers to the phenomenon of decreasing cell total capacity as the cell ages. Both the cell's resistance and capacity are time-varying parameters. The prior art uses the following different approaches to estimate SOH: the discharge test, chemistry-dependent methods, Ohmic tests, and partial discharge. The discharge test completely discharges a fully charged cell in order to determine its total capacity. This test interrupts system function and wastes cell energy. Chemistry-dependent methods include measuring the level of plate corrosion, electrolyte density, and "coup de fouet" for lead-acid batteries. Ohmic tests include resistance, conductance and impedance tests, perhaps combined with fuzzy-logic algorithms and/or neural networks. These methods require invasive measurements. Partial discharge and other methods compare cell-under-test to a good cell or model of a good cell.

There is a need for a method to concurrently estimate the state and parameters of a cell. Furthermore, there is a need for tests that do not interrupt system function and do not waste energy, methods that are generally applicable (e.g., to different types of cell electrochemistries and to different applications), methods that do not require invasive measurements, and more rigorous approaches. There is a need for methods and apparatus for automatically estimating time-varying parameters, such as the cell's resistance and capacity. There is a need for a method that will work with different configurations of parallel and/or series cells in a battery pack.

SUMMARY OF THE INVENTION

A first aspect is a method for estimation of the augmented state of an electrochemical cell, the method comprising: making an internal augmented states prediction of the cell where the augmented state comprises at least one internal state value and at least one internal parameter value; making an uncertainty prediction of the internal augmented states prediction; correcting the internal augmented states prediction and the uncertainty prediction; and applying an algorithm that iterates the making an internal augmented states prediction, the making an uncertainty prediction and the correcting to yield an ongoing estimation to the augmented state and an ongoing uncertainty to the augmented state estimation.

Another aspect of an exemplary embodiment is an apparatus configured to estimate present augmented state of a cell pack system comprising: a component configured to make an internal augmented states prediction of a cell; a component configured to make an uncertainty prediction of the internal augmented states prediction; a component configured to correct the internal augmented states prediction and the uncertainty prediction; and a component configured to apply an algorithm that iterates steps taken by the component configured to make an internal augmented states prediction, the component configured to make an uncertainty prediction and the component configured to correct to yield an ongoing estimation to the augmented state and an ongoing uncertainty to the augmented state estimation.

Also disclosed herein in an exemplary embodiment is a system for estimating present augmented state of an electrochemical cell comprising: a means for making an internal augmented states prediction of the cell where the augmented state comprises at least one internal state value and at least one internal parameter value; a means for making an uncertainty prediction of the internal augmented states prediction; a means for correcting the internal augmented states prediction and the uncertainty prediction; and a means for applying an algorithm that iterates the making an internal augmented states prediction, the making an uncertainty prediction and the correcting to yield an ongoing estimation to the augmented state and an ongoing uncertainty to the augmented state estimation.

Further, disclosed herein in another exemplary embodiment is a storage medium encoded with a machine-readable computer program code including instructions for causing a computer to implement the abovementioned method for estimating present augmented states of an electrochemical cell.

Also disclosed herein in yet another exemplary embodiment computer data signal embodied in a computer readable medium. The computer data signal comprises code configured to cause a computer to implement the abovementioned method for estimating present augmented states of an electrochemical cell.

BRIEF DESCRIPTION OF THE DRAWINGS

These and other features, aspects and advantages of the present invention will become better understood with regard to the following description, appended claims and accompanying drawing wherein like elements are numbered alike in the several Figures:

DETAILED DESCRIPTION OF THE INVENTION

Figure 1:
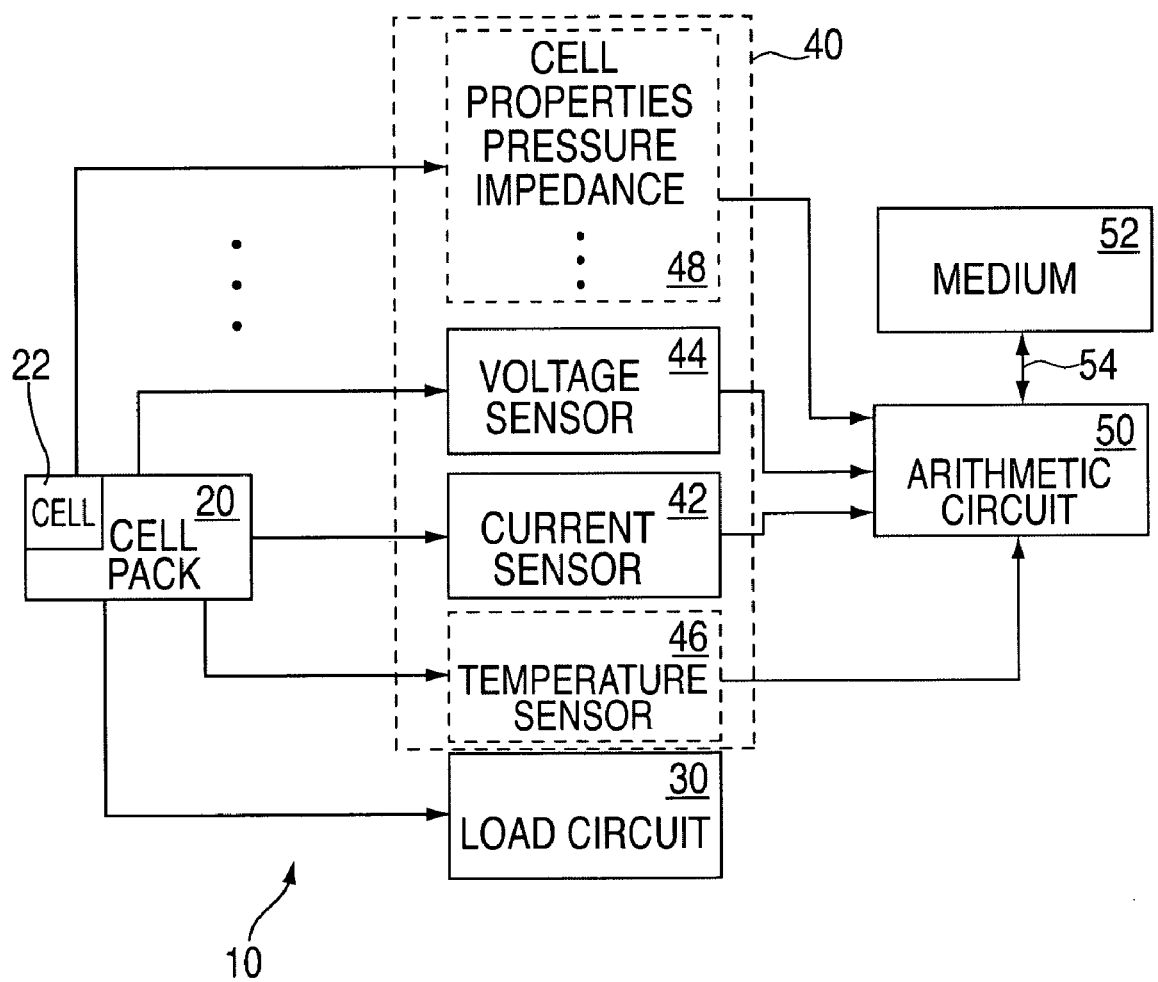
FIG. 1 is a block diagram illustrating an exemplary system for state and parameter estimation in accordance with an exemplary embodiment of the invention.
Figure 2:
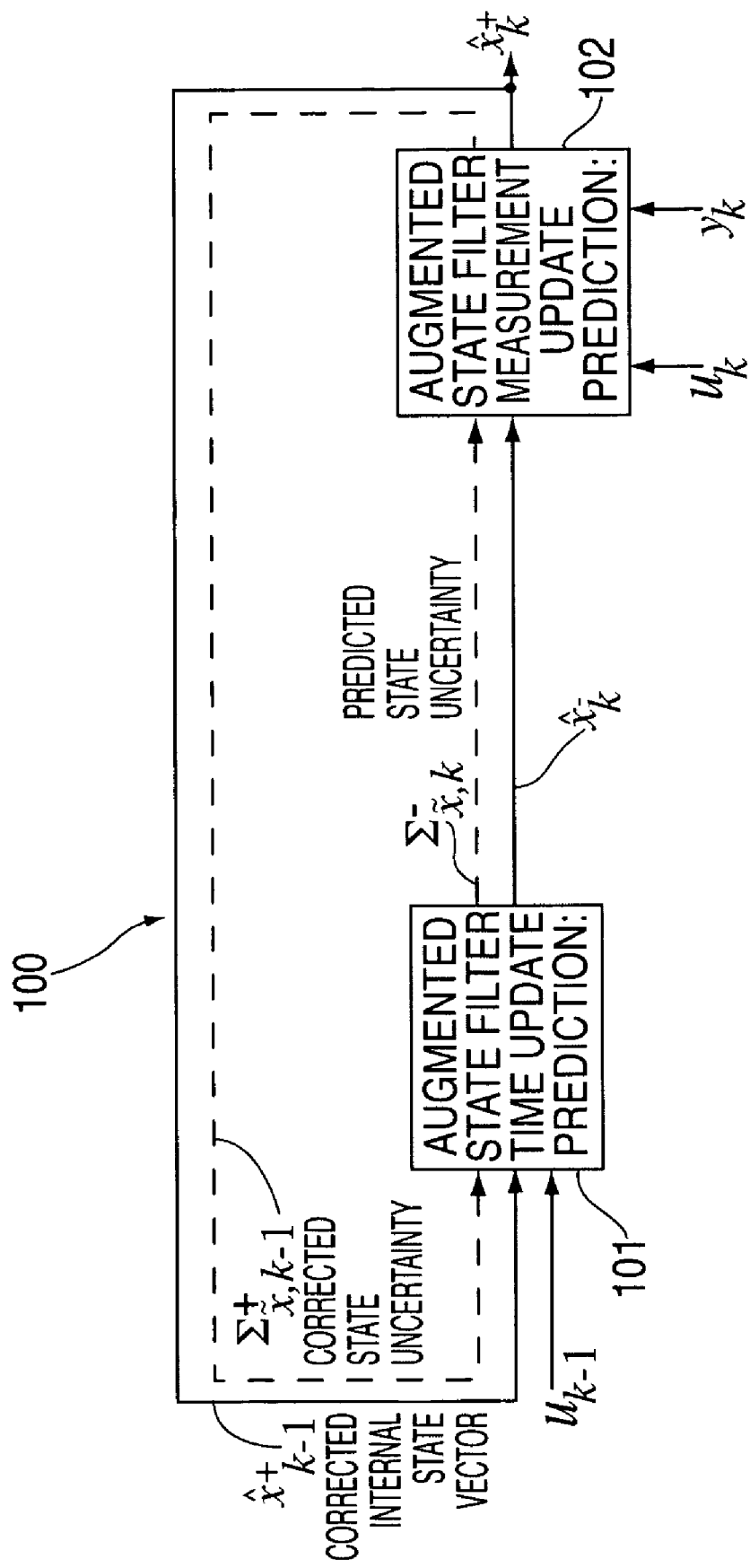
FIG. 2 is a block diagram depicting a method of joint filtering, in accordance with an exemplary embodiment of the invention.

Disclosed herein and various embodiments are methods, systems and apparatus for the estimation of states and parameters of an electrochemical cell using joint filtering are disclosed. Referring now to FIGS. 1 and 2, in the following description, numerous specific details are set forth in order to provide a more complete understanding of the present invention. It will be appreciated that while the exemplary embodiments are described with reference to a battery cell, numerous electrochemical cells hereinafter referred to as a cell, may be employed, including, but not limited to, batteries, battery packs, ultracapacitors, capacitor banks, fuel cells, electrolysis cells, and the like, as well as combinations including at least one of the foregoing. Furthermore, it will be appreciated that a battery or battery pack may include a plurality of cells, where the exemplary embodiments disclosed herein are applied to one or more cells of the plurality.

One or more exemplary embodiments of the present invention estimate cell state and parameter values using joint filtering. One or more exemplary embodiments of the present invention estimate cell state and parameter values using joint Kalman filtering. Some embodiments of the present invention estimate cell state and parameter values using joint extended Kalman filtering. Some embodiments simultaneously estimate SOC, power- and/or capacity-fade, while others estimate additional cell state values and/or additional time-varying parameter values. It will further be appreciated that while the term filtering is employed for description and illustration of the exemplary embodiments, the terminology is intended to include methodologies of recursive prediction and correction commonly denoted as filtering, including but not limited to Kalman filtering and/or extended Kalman filtering.

FIG. 1 shows the components of the parameter estimator system 10 according an embodiment of the present invention. Electrochemical cell pack 20 comprising a plurality of cells 22, e.g., battery is connected to a load circuit 30. For example, load circuit 30 could be a motor in an Electric Vehicle (EV) or a Hybrid Electric Vehicle (HEV). An apparatus for measuring various cell characteristics and properties is provided as 40. The measurement apparatus 40 may include but not be limited to a device for measurement of cell terminal voltage such as a voltage sensor 42, e.g. a voltmeter and the like, while measurements of cell current are made with a current sensing device 44, e.g., an ammeter and the like. Optionally, measurements of cell temperature are made with a temperature sensor 46, e.g., a thermometer and the like. Additional cell properties, such as internal pressure or impedance, may be measured using (for example) pressure sensors and/or impedance sensors 48 and may be employed for selected types of cells 22 of cell pack 20. Various sensors may be employed as needed to evaluate the characteristics and properties of the cell(s) 22. Voltage, current, and optionally temperature and cell-property measurements are processed with an arithmetic circuit 50, e.g., processor or computer, which estimates the parameters of the cell(s) 22. The system may also include a storage medium 52 comprising any computer usable storage medium known to one of ordinary skill in the art. The storage medium is in operable communication with arithmetic circuit 50 employing various means, including, but not limited to a propagated signal 54. It should be appreciated that no instrument is required to take measurements from the internal chemical components of the cell 22 although such instrumentation may be used with this invention. Also note that all measurements may be non-invasive; that is, no signal must be injected into the system that might interfere with the proper operation of load circuit 30.

In order to perform the prescribed functions and desired processing, as well as the computations therefore (e.g., the modeling, estimation of parameters prescribed herein, and the like), arithmetic circuit 50 may include, but not be limited to, a processor(s), gate array(s), custom logic, computer(s), memory, storage, register(s), timing, interrupt(s), communication interfaces, and input/output signal interfaces, as well as combinations comprising at least one of the foregoing. Arithmetic circuit 50 may also include inputs and input signal filtering and the like, to enable accurate sampling and conversion or acquisitions of signals from communications interfaces and inputs. Additional features of arithmetic circuit 50 and certain processes therein are thoroughly discussed at a later point herein.

One or more embodiments of the invention may be implemented as new or updated firmware and software executed in arithmetic circuit 50 and/or other processing controllers. Software functions include, but are not limited to firmware and may be implemented in hardware, software, or a combination thereof. Thus a distinct advantage of the present invention is that it may be implemented for use with existing and/or new processing systems for electrochemical cell charging and control.

In an exemplary embodiment, Arithmetic circuit 50 uses a mathematical model of the cell 22 that includes indicia of a dynamic system state. In one embodiment of the present invention, a discrete-time model is used. An exemplary model in a (possibly nonlinear) discrete-time state-space form has the form:

$$x_{k+1} = f(x_k, u_k, \theta_k) + w_k$$

$$y_k = g(x_k, u_k, \theta_k) + v_k, \quad (1)$$

where $x_k$ is the system state, $\theta_k$ is the set of time varying model parameters, $u_k$ is the exogenous input, $y_k$ is the system output, and $w_k$ and $v_k$ are "noise" inputs—all quantities may be scalars or vectors. $f(\cdot,\cdot,\cdot)$ and $g(\cdot,\cdot,\cdot)$ are functions defined by the cell model being used. Non-time-varying numeric values required by the model may be embedded within $f(\cdot,\cdot,\cdot)$ and $g(\cdot,\cdot,\cdot)$, and are not included in $\theta_k$.

The system state includes, at least, a minimum amount of information, together with the present input and a mathematical model of the cell 22, needed to predict the present output. For a cell 22, the state might include: SOC, polarization voltage levels with respect to different time constants, and hysteresis levels, for example. The system exogenous input $u_k$ includes at minimum the present cell current $i_k$, and may, optionally, include cell temperature (unless temperature change is itself modeled in the state). The system parameters $\theta_k$ are the values that change only slowly with time, in such a way that they may not be directly determined with knowledge of the system measured input and output. These might include, but not be limited to: cell capacity(ies), resistance(s), polarization voltage time constant(s), polarization voltage blending factor(s), hysteresis blending factor(s), hysteresis rate constant(s), efficiency factor(s), and so forth. The model output $y_k$ corresponds to physically measurable cell quantities or those directly computable from measured quantities—at minimum, the cell voltage under load.

A mathematical model of parameter dynamics is also utilized. An exemplary model has the form:

$$\theta_{k+1} = \theta_k + r_k. \quad (2)$$

The equation states that the parameters are essentially constant, but that they may change slowly over time, in this instance, modeled by a fictitious "noise" process denoted, $r_k$.

Turning now to FIG. 2 as well, within a joint filter shown generally as 100, the dynamics of the state and the dynamics of the parameters are combined to make an augmented system. An exemplary model has the form:

$$\begin{bmatrix} x_{k+1} \\ \theta_{k+1} \end{bmatrix} = \begin{bmatrix} f(x_k, u_k, \theta_k) \\ \theta_k \end{bmatrix} + \begin{bmatrix} w_k \\ r_k \end{bmatrix}$$

$$y_k = g(x_k, u_k, \theta_k) + v_k.$$

Note that to simplify notation, we will sometimes refer to the vector comprising the present state and present parameters as $\chi_k$.

With the augmented model of the system state dynamics and parameter dynamics defined, in an exemplary embodiment, a procedure of joint filtering is applied. Once again, alternatively, a joint Kalman filter 100 may be employed, or a joint extended Kalman filter 100. Table 1 is an exemplary implementation of the methodology and system utilizing joint extended Kalman filtering. The procedure is initialized by setting the augmented state estimate $\hat{\chi}_0$ to the best guess of the true augmented state by setting the top portion to $E[x_0]$ and the bottom portion to $E[\theta_0]$. The estimation-error covariance matrix $\Sigma_{\tilde{\chi}}^+$ is also initialized. Table 1: Joint extended Kalman filter for state and weight update.

State-space models:

$$\begin{bmatrix} x_{k+1} \\ \theta_{k+1} \end{bmatrix} = \begin{bmatrix} f(x_k, u_k, \theta_k) \\ \theta_k \end{bmatrix} + \begin{bmatrix} w_k \\ r_k \end{bmatrix} \text{ or } \chi_{k+1} = F(\chi_k, u_k) + \begin{bmatrix} w_k \\ r_k \end{bmatrix}$$

$$y_k = g(x_k, u_k, \theta_k) + v_k. \qquad y_k = g(\chi_k, u_k) + v_k.$$

where $w_k$, $v_k$, and $r_k$ are independent, zero-mean,

Gaussian noise processes of covariance matrices $\sum_w$, $\sum_v$, and $\sum_r$ respectively.

Definitions:

$$A_{k-1} = \left.\frac{\partial F(\chi_{k-1}, u_{k-1})}{\partial \chi_{k-1}}\right|_{\chi_{k-1} = \hat{\chi}_{k-1}^+} \quad C_k = \left.\frac{\partial g(\chi_k, u_k)}{\partial \chi_k}\right|_{\chi_k = \hat{\chi}_k^-}$$

Initialization:

For $k = 0$, set $$\hat{\chi}_0^+ = E[\chi_0], \sum_{\tilde{\chi},0}^+ = E[(\chi_0 - \hat{\chi}_0^+)(\chi_0 - \hat{\chi}_0^+)^T].$$

Computation:

For $k = 1, 2, \ldots,$ compute:

Time update $$\hat{\chi}_k^- = F(\hat{\chi}_{k-1}^+, u_{k-1})$$

$$\sum_{\tilde{\chi},k}^- = A_{k-1} \sum_{\tilde{\chi},k-1}^+ A_{k-1}^T + diag\left(\sum_w, \sum_r\right).$$

Measurement update $$L_k = \sum_{\tilde{\chi},k}^- (C_k)^T \left[ C_k \sum_{\tilde{\chi},k}^- (C_k)^T + \sum_v \right]^{-1}$$

$$\hat{\chi}_k^+ = \hat{\chi}_k^- + L_k[y_k - g(\hat{\chi}_k^-, u_k)]$$

$$\sum_{\tilde{\chi},k}^+ = (I - L_k C_k)\sum_{\tilde{\chi},k}^-.$$

In this example, several steps are performed in each measurement interval. First, the augmented state estimate $\hat{\chi}$ is propagated forward in time, through the function F. The augmented state vector uncertainty is also updated. Various possibilities exist for updating the uncertainty estimate—the table gives only one example. A measurement of the cell output is made, and compared to the predicted output based on the augmented state estimate, $\hat{\chi}$; the difference is used to update the values of $\hat{\chi}$. It may readily be appreciated that the steps outlined in the table may be performed in a variety of orders. While the table lists an exemplary ordering for the purposes of illustration, those skilled in the art will be able to identify many equivalent ordered sets of equations.

Continuing with FIG. 2, an exemplary implementation of an exemplary embodiment of the invention is depicted. A single filter 100 jointly updates the state and parameter estimates. The filter has a time update or prediction 101 aspect and a measurement update or correction 102 aspect. Time update/prediction block 101 receives as input the previous exogenous input $u_{k-1}$ (which might include cell current and/or temperature, for example) along with the previously estimated augmented state value $\hat{\chi}_{k-1}^+$ and augmented state uncertainty estimate $\Sigma_{\tilde{\chi},k-1}^+$. The time update/prediction block 101 provides predicted augmented state $\hat{\chi}_k^-$ and predicted augmented state uncertainty $\Sigma_{\tilde{\chi},k}^-$ output to augmented state measurement update/correction block 102. State measurement update/correction block 102 also receives the predicted augmented state $\hat{\chi}_k^-$ and predicted augmented state uncertainty $\Sigma_{\tilde{\chi},k}^-$, as well as the exogenous input $u_k$, and the system output $y_k$, while providing current system augmented state estimate $\hat{\chi}_k^+$ and augmented state uncertainty estimate $\Sigma_{\tilde{\chi},k}^+$. It will also be appreciated that a minus notation denotes that the vector is the result of the prediction components 101 of the filter 100, while the plus notation denotes that the vector is the result of the correction component 102 of the filter 100.

Several of the exemplary embodiments illustrating this invention require a mathematical model of cell state and output dynamics for the particular application. In the examples above, this is accomplished by defining specific functions for general $f(\cdot,\cdot,\cdot)$ and $g(\cdot,\cdot,\cdot)$. An exemplary embodiment uses a cell model that includes effects due to one or more of the open-circuit-voltage (OCV) for the cell 22, internal resistance, voltage polarization time constants, and a hysteresis level. Similarly, parameter values including, but not limited to: an efficiency factor(s) such as Coulombic efficiency, denoted $\eta_{i,k}$; cell capacity(ies), denoted $C_k$; polarization voltage time constant(s), denoted $a_{1,k}, \ldots a_{n_f,k}$; polarization voltage blending factor(s), denoted as $g_{1,k}, \ldots g_{n_f-1,k}$; the cell resistance(s), denoted as $R_k$; a hysteresis blending factor(s) denoted as $M_k$; the hysteresis rate constant(s), denoted as $\gamma_k$; and the like as well as combinations including at least one of the foregoing. For the purpose of example, parameter values are fitted to this model structure to model the dynamics of high-power Lithium-Ion Polymer Battery (LiPB) cells, although the structure and methods presented here are general and apply to other electrochemistries.

In an exemplary embodiment, SOC is captured by one state of the model. This equation to address SOC is:

$$z_{k+1} = z_k - (\eta_{i,k} \Delta t / C_k) i_k \tag{3}$$

where $\Delta t$ represents the inter-sample period (in seconds), $C_k$ represents the cell capacity (in ampere-seconds), $z_k$ is the cell SOC 22 at time index k, $i_k$ is the cell current 22, and $\eta_{i,k}$ is the Coulombic efficiency of a cell 22 at current level $i_k$.

In another exemplary embodiment, the polarization voltage levels are captured by several filter states. If we let there be $n_f$ polarization voltage time constants, then $$f_{k+1} = A_f f_k + B_f i_k. \tag{4}$$

The matrix $A_f \in \Re^{n_f \times n_f}$ may be a diagonal matrix with real-valued polarization voltage time constants $a_{1,k} \ldots a_{n_f,k}$. If so, the system is stable if all entries have magnitude less than one. The vector $B_f \in \Re^{n_f \times 1}$ may simply be set to $n_f$ "1"s. The entries of $B_f$ are not critical as long as they are non-zero. The value of $n_f$ entries in the $A_f$ matrix are chosen as part of the system identification procedure to best fit the model parameters to measured cell data. The $A_f$ and $B_f$ matrices may vary with time and other factors pertinent to the present battery pack operating condition.

In yet another exemplary embodiment, the hysteresis level is captured by a single state $$h_{k+1} = \exp\left(-\left|\frac{\eta_{i,k} i_k \gamma_k \Delta t}{C_k}\right|\right) h_k + \left(1 - \exp\left(-\left|\frac{\eta_{i,k} i_k \gamma_k \Delta t}{C_k}\right|\right)\right) sgn(i_k), \tag{5}$$

where $\gamma_k$ is the hysteresis rate constant, again found by system identification.

In a further exemplary embodiment, the overall model state is $$x_k = [f_k^T \, h_k \, z_k]^T, \tag{6}$$

where other orderings of states are possible. In this instance, the state equation for the model is formed by combining all of the individual equations identified above.

The output equation that combines the state values to predict cell voltage is $$v_k = g(x_k, u_k, \theta_k) \tag{7}$$
$$= OCV(z_k) + G_k f_k - R_k i_k + M_k h_k,$$

where $G_k \in \Re^{1 \times n_f}$ is a vector of polarization voltage blending factors $g_{1,k} \ldots g_{n_f,k}$ that blend the polarization voltage states together in the output, $R_k$ is the cell resistance(s) (different values may be used for discharge/charge), and $M_k$ is the hysteresis blending factor. Note, $G_k$ may be constrained such that the dc-gain from $i_k$ to $G_k f_k$ is zero.

In this example, the parameters are $$\theta_k = [\eta_{i,k}, C_k, a_{1,k} \ldots a_{n_f,k}, g_{1,k} \ldots g_{n_f-1,k}, \gamma_k, R_k, M_k]^T. \tag{8}$$

The augmented state vector $\chi_k$ is formed by joining the state vector (or combined state vector e.g. Equation (6)) and the parameter vector e.g., Equation (7) into one vector. For example, $$\chi_k = [x_k^T, h_k, z_k, \eta_{i,k}, C_k, a_{1,k} \ldots a_{n_f,k}, g_{1,k} \ldots g_{n_f-1,k}, \gamma_k, R_k, M_k]^T$$

where other orderings of states and parameters within the augmented state vector are possible. The quantities in $\chi_k$ comprise all the details required to compute the equations for $f(\cdot,\cdot,\cdot)$ (e.g., Equations (3)-(5)) and $g(\cdot,\cdot,\cdot)$ (e.g., Equation 7).

In any embodiment, the joint filter 100 will adapt a state estimate and a parameter estimate so that a model input-output relationship matches the measured input-output data as closely as possible. This does not guarantee that the model augmented state converges to physical augmented state values. In an exemplary embodiment, the cell model used for joint filtering may be further supplemented by appending the cell model with a secondary cell model that includes as outputs those augmented states that must converge to their correct values. An exemplary embodiment takes extra steps to ensure that one model augmented state converges to SOC:

$$g(x_k, u_k, \theta) = \begin{bmatrix} OCV(z_k) - R_k i_k + h_k + G_k f_k \\ z_k \end{bmatrix}. \tag{9}$$

The supplemented model output is compared to a measured output in the joint filter 100. In an exemplary embodiment, a measured value for SOC may be approximated using $\hat{z}_k$ derived as $$y_k \approx OCV(z_k) - R_k i_k$$

$$OCV(z_k) \approx y_k + R_k i_k$$

$$\hat{z}_k = OCV^{-1}(v_k + R_k i_k). \quad (10)$$

By measuring the voltage of a cell under load, the cell current, and having knowledge of $R_k$, (perhaps through $\hat{\theta}_k$ from the joint filter 100), and knowing the inverse OCV function for the cell chemistry, this example computes a noisy estimate of SOC, $\hat{z}_k$.

In this example, a joint filter 100 is run on this modified model, with the "measured" information in the measurement update being $$\begin{bmatrix} v_k \\ \hat{z}_k \end{bmatrix}.$$

Experimentation has shown that while the "noise" of $\hat{z}_k$ (short-term bias due to hysteresis effects and polarization voltages being ignored) prohibits it from being used as the primary estimator of SOC, its expected long-term behavior in a dynamic environment is accurate, and maintains the accuracy of the SOC state in the joint filter 100.

Thus, a method for simultaneous estimation of cell state and parameters has been described in conjunction with a number of specific embodiments. One or more embodiments use a Kalman filter 100. Some embodiments use an extended Kalman filter 100. Further, some embodiments include a mechanism to force convergence of state-of-charge. The present invention is applicable to a broad range of applications, and cell electrochemistries.

The disclosed method may be embodied in the form of computer-implemented processes and apparatuses for practicing those processes. The method can also be embodied in the form of computer program code containing instructions embodied in tangible media 52, such as floppy diskettes, CD-ROMs, hard drives, or any other computer-readable storage medium, wherein, when the computer program code is loaded into and executed by a computer, the computer becomes an apparatus capable of executing the method. The present method can also be embodied in the form of computer program code, for example, whether stored in a storage medium, loaded into and/or executed by a computer, or as data signal 54 transmitted whether a modulated carrier wave or not, over some transmission medium, such as over electrical wiring or cabling, through fiber optics, or via electromagnetic radiation, wherein, when the computer program code is loaded into and executed by a computer, the computer becomes an apparatus capable of executing the method. When implemented on a general-purpose microprocessor, the computer program code segments configure the microprocessor to create specific logic circuits.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for estimating a present augmented state of an electrochemical cell system, the method comprising:
   making an internal augmented states prediction of the cell where said augmented state always comprises at least one internal state value and at least one internal parameter value;
   making an uncertainty prediction of said internal augmented states prediction;
   correcting said internal augmented states prediction and said uncertainty prediction;
   applying an algorithm that iterates said making an internal augmented states prediction, said making an uncertainty prediction and said correcting;
   providing an ongoing estimation of said augmented state and an ongoing uncertainty of said augmented state estimation as a result of the application of the algorithm; and
   ensuring convergence of one or more augmented states to their respective physical values.

2. The method of claim 1 wherein said making an internal augmented states prediction comprises:
   determining a current measurement;
   determining a voltage measurement; and
   using said current measurement and said voltage measurement in a mathematical model to make said internal augmented states prediction.

3. The method of claim 2 wherein said making an uncertainty prediction comprises using said current measurement and said voltage measurement in a mathematical model to make said uncertainty prediction.

4. The method of claim 3 wherein said correcting comprises:
   computing a gain factor;
   computing a corrected internal augmented states prediction using said gain factor, said voltage measurement and said internal augmented states prediction; and
   computing a corrected uncertainty prediction using said gain factor and said uncertainty prediction.

5. The method of claim 4 wherein said applying comprises using said corrected augmented internal states prediction and said corrected uncertainty prediction to obtain predictions for a next time step where said algorithm repeats.

6. The method of claim 5 wherein said algorithm is at least one of a Kalman Filter and an extended Kalman filter.

7. The method of claim 6 wherein an augmented state vector of said algorithm includes one or more of: a state-of-charge, a voltage polarization level, a hysteresis level, a resistance, a capacity, a polarization voltage time constant, a polarization voltage blending factor, a hysteresis blending factor, a hysteresis rate constant, and an efficiency factor.

8. The method of claim 2 wherein said making an internal augmented states prediction further comprises:
   determining a temperature measurement; and
   using said temperature measurement, said current measurement, and said voltage measurement in a mathematical model to make said internal augmented states prediction.

9. The method of claim 8 wherein said making an uncertainty prediction comprises using said temperature measurement, said current measurement, and said voltage measurement in a mathematical model to make said uncertainty prediction.

10. The method of claim 9 wherein said correcting comprises:
computing a gain factor;
computing a corrected internal states prediction using said gain factor, said voltage measurement and said internal states prediction; and
computing a corrected uncertainty prediction using said gain factor and said uncertainty prediction.

11. The method of claim 10 wherein said applying comprises using said corrected internal states prediction and said corrected uncertainty prediction to obtain predictions for a next time step where said algorithm repeats.

12. The method of claim 11 wherein said algorithm is at least one of a Kalman Filter and an extended Kalman Filter.

13. The method of claim 12 wherein an augmented state vector of said algorithm includes one or more of: a state-of-charge, a voltage polarization level, a hysteresis level, a resistance, a capacity, a polarization voltage time constant, a polarization voltage blending factor, a hysteresis blending factor, a hysteresis rate constant, and an efficiency factor.

14. The method of claim 2 wherein said making an uncertainty prediction further comprises:
determining a temperature measurement; and
using said temperature measurement, said current measurement, and said voltage measurement in a mathematical model to make said uncertainty prediction.

15. The method of claim 1 wherein said making an uncertainty prediction comprises:
determining a current measurement;
determining a voltage measurement; and
using said current measurement and said voltage measurement in a mathematical model to make said uncertainty prediction.

16. The method of claim 15 wherein said making an uncertainty prediction further comprises:
determining a temperature; and
using said temperature measurement, said current measurement, and said voltage measurement in a mathematical model to make said uncertainty prediction.

17. The method of claim 16 wherein said correcting comprises:
computing a gain factor;
computing a corrected internal states prediction using said gain factor, said voltage measurement and said internal states prediction; and
computing a corrected uncertainty prediction using said gain factor and said uncertainty prediction.

18. The method of claim 17 wherein said applying comprises using said corrected internal states prediction and said corrected uncertainty prediction to obtain predictions for a next time step where said algorithm repeats.

19. The method of claim 18 wherein said algorithm is at least one of a Kalman Filter and an extended Kalman Filter.

20. The method of claim 1 wherein said ensuring includes supplementing a cell model output with said augmented states whose convergence is desired.

21. The method of claim 20 wherein said mechanism further includes supplementing a measurement vector with corresponding estimates of said augmented states based on present measured values.

22. The method of claim 21 wherein a filter is used to adapt an augmented state estimate based on said supplemented cell model output and said supplemented measurement vector.

23. The method of claim 22 wherein said filter is at least one of a Kalman filter and an extended Kalman filter.

24. An apparatus configured to estimate a present augmented state of a cell pack system, the apparatus comprising:

a component configured to make an internal augmented states prediction of a cell where said augmented state always comprises at least one internal state value and at least one internal parameter value;
a component configured to make an uncertainty prediction of said internal augmented states prediction;
a component configured to correct said internal augmented states prediction and said uncertainty prediction;
a component configured to apply an algorithm that iterates steps taken by said component configured to make an internal augmented states prediction, said component configured to make an uncertainty prediction and said component configured to correct; and
a component configured to yield an ongoing estimation of said augmented state and an ongoing uncertainty of said augmented state estimation as a result of the application of the algorithm; and
a component configured to ensure convergence of one or more augmented states to their respective physical values.

25. The apparatus of claim 24 wherein said component configured to make an internal augmented states prediction comprises:
a component configured to determine a current measurement;
a component configured to determine a voltage measurement; and
a component configured to use said parameter estimate and said current measurement and said voltage measurement in a mathematical model to make said internal augmented states prediction.

26. The apparatus of claim 25 wherein said component configured to make an uncertainty prediction comprises a component configured to use said current measurement and said voltage measurement in a mathematical model to make said uncertainty prediction.

27. The apparatus of claim 26 wherein said component configured to correct comprises:
a component configured to compute a gain factor;
a component configured to compute a corrected internal augmented states prediction using said gain factor, said voltage measurement and said internal augmented states prediction; and
a component configured to compute a corrected uncertainty prediction using said gain factor and said uncertainty prediction.

28. The apparatus of claim 27 wherein said component configured to apply comprises a component configured to use said corrected internal augmented states prediction and said corrected uncertainty prediction to obtain predictions for a next time step where said algorithm repeats.

29. The apparatus of claim 28 wherein said algorithm is at least one of a Kalman Filter and an Extended Kalman Filter.

30. The apparatus of claim 29 wherein an augmented state vector of said algorithm includes one or more of: a state-of-charge, a voltage polarization level, a hysteresis level, a resistance, a capacity, a polarization voltage time constant, a polarization voltage blending factor, a hysteresis blending factor, a hysteresis rate constant, and an efficiency factor.

31. The apparatus of claim 25 wherein said component configured to make an internal augmented states prediction further comprises:
a component configured to determine a temperature measurement; and a component configured to use said temperature measurement, said current measurement, and said voltage measurement in a mathematical model to make said internal states prediction.

32. The apparatus of claim 31 wherein said component configured to make an uncertainty prediction comprises a component configured to use said temperature measurement, said current measurement, and said voltage measurement in a mathematical model to make said uncertainty prediction.

33. The apparatus of claim 32 wherein said component configured to correct comprises:
a component configured to compute a gain factor;
a component configured to compute a corrected internal augmented states prediction using said gain factor, said voltage measurement and said internal states prediction; and
a component configured to compute a corrected uncertainty prediction using said gain factor and said uncertainty prediction.

34. The apparatus of claim 33 wherein said component configured to apply comprises a component configured to use said corrected internal augmented states prediction and said corrected internal states prediction and said corrected uncertainty prediction to obtain predictions for a next time step where said algorithm repeats.

35. The apparatus of claim 34 wherein said algorithm is at least one of a Kalman Filter and an Extended Kalman Filter.

36. The apparatus of claim 35 wherein an augmented state vector of said algorithm includes one or more of: a state-of-charge, a voltage polarization level, a hysteresis level, a resistance, a capacity, a polarization voltage time constant, a polarization voltage blending factor, a hysteresis blending factor, a hysteresis rate constant, and an efficiency factor.

37. The apparatus of claim 25 wherein said component configured to make an uncertainty prediction further comprises:
a component configured to determine a temperature measurement; and
a component configured to use said temperature measurement, said current measurement, and said voltage measurement in a mathematical model to make said uncertainty prediction.

38. The apparatus of claim 24 wherein said component configured to make an uncertainty prediction comprises:
a component configured to determine a current measurement;
a component configured to determine a voltage measurement; and
a component configured to use said current measurement and said voltage measurement in a mathematical model to make said uncertainty prediction.

39. The apparatus of claim 38 wherein said component configured to make an uncertainty prediction further comprises:
a component configured to determine a temperature measurement; and
a component configured to use said temperature measurement, said current measurement, and said voltage measurement in a mathematical model to make said uncertainty prediction.

40. The apparatus of claim 39 wherein said component configured to correct comprises:
a component configured to compute a gain factor;
a component configured to compute a corrected internal augmented states prediction using said gain factor, said voltage measurement and said internal states prediction; and
a component configured to compute a corrected uncertainty prediction using said gain factor and said uncertainty prediction.

41. The apparatus of claim 40 wherein said component configured to apply comprises a component configured to use said corrected internal augmented states prediction and said corrected internal states prediction and said corrected uncertainty prediction to obtain predictions for a next time step where said algorithm repeats.

42. The apparatus of claim 41 wherein said algorithm is at least one of a Kalman Filter and an Extended Kalman Filter.

43. The apparatus of claim 24 wherein said component configured to insure convergence includes a component configured to supplement a cell model output with said one or more augmented states whose convergence is desired.

44. The apparatus of claim 43 wherein said component configured to insure convergence further includes a component configured to supplement a respective measurement vector with corresponding estimates of said one or more augmented states based on present measured values.

45. The apparatus of claim 44 wherein a component is configured to implement a filter to adapt a augmented state estimate based on said supplemented cell model output and said supplemented measurement vector.

46. The apparatus of claim 45 wherein said filter is at least one of a Kalman filter and Extended Kalman Filter.

47. A system for estimating a present augmented state of an electrochemical cell, the system comprising:
a means for making an internal augmented states prediction of the cell where said augmented state always comprises at least one internal state value and at least one internal parameter value;
a means for making an uncertainty prediction of said internal augmented states prediction;
a means for correcting said internal augmented states prediction and said uncertainty prediction;
a means for applying an algorithm that iterates said making an internal augmented states prediction, said making an uncertainty prediction and said correcting;
a means for yielding an ongoing estimation of said augmented state and an ongoing uncertainty of said augmented state estimation as a result of applying the algorithm; and
a means for ensuring convergence of one or more augmented states to their respective physical values.

48. A computer readable medium encoded with a machine-readable computer program code, wherein said computer readable medium includes instructions for causing a computer to implement a method for estimating present augmented state of an electrochemical cell, the method comprising:
making an internal augmented states prediction of the cell where said augmented state always comprises at least one internal state value and at least one internal parameter value;
making an uncertainty prediction of said internal augmented states prediction;
correcting said internal augmented states prediction and said uncertainty prediction;
applying an algorithm that iterates said making an internal augmented states prediction, said making an uncertainty prediction and said correcting;
yielding an ongoing estimation of said augmented state and an ongoing uncertainty of said augmented state estimation as a result of the application of the algorithm; and ensuring convergence of one or more augmented states to their respective physical values.

49. The method of claim 1, wherein the at least one internal parameter value is selected from the group consisting of a voltage polarization level, a hysteresis level, a cell resistance, a cell capacity, a polarization voltage time constant, a polarization voltage blending factor, a hysteresis blending factor, a hysteresis rate constant, a Coulombic efficiency factor and a combination thereof.

50. The apparatus of claim 24, wherein the at least one internal parameter value is selected from the group consisting of a voltage polarization level, a hysteresis level, a cell resistance, a cell capacity, a polarization voltage time constant, a polarization voltage blending factor, a hysteresis blending factor, a hysteresis rate constant, a Coulombic efficiency factor, and a combination thereof.

* * * * *